(12) United States Patent
Shu (10) Patent No.: US 11,283,237 B2
(45) Date of Patent: Mar. 22, 2022

(54) LASER WAVELENGTH STABILIZATION APPARATUS

(71) Applicant: Coherent, Inc., Santa Clara, CA (US)

(72) Inventor: Qize Shu, San Jose, CA (US)

(73) Assignee: Coherent, Inc., Santa Clara, CA (US)

( * ) Notice: Subject to any disclaimer, the term of this patent is extended or adjusted under 35 U.S.C. 154(b) by 178 days.

(21) Appl. No.: 16/518,689

(22) Filed: Jul. 22, 2019

(65) Prior Publication Data

US 2021/0028599 A1 Jan. 28, 2021

(51) Int. Cl.
*H01S 5/0683* (2006.01)
*G01J 9/02* (2006.01)

(52) U.S. Cl.
CPC ............. *H01S 5/0683* (2013.01); *G01J 9/02* (2013.01)

(58) Field of Classification Search
CPC .... H01S 5/0683; H01S 3/08036; H01S 3/137; H01S 3/139; H01S 5/0687; H01S 5/0654; H01S 3/1305; H01S 5/0014; G01J 9/02
See application file for complete search history.

(56) References Cited

U.S. PATENT DOCUMENTS

| | | | | |
|---|---|---|---|---|
| 4,564,289 A * | 1/1986 | Spillman, Jr. | .......... | G01D 5/344 250/225 |
| 4,759,628 A * | 7/1988 | Tatsuno | .................... | G01J 9/04 356/489 |
| 5,003,546 A * | 3/1991 | Lidgard | ................. | H01S 5/0687 356/519 |
| 5,537,432 A * | 7/1996 | Mehuys | ............. | G02B 6/12004 372/32 |
| 5,825,792 A | 10/1998 | Villeneuve et al. | | |
| 6,097,742 A | 8/2000 | Caprara et al. | | |
| 6,205,159 B1 | 3/2001 | Sesko et al. | | |
| 6,965,622 B1 * | 11/2005 | Cho | ....................... | H01S 5/0612 372/33 |
| 2003/0035119 A1 * | 2/2003 | Myatt | .................... | G01J 9/0246 356/519 |
| 2003/0108072 A1 | 6/2003 | Hedin | | |
| 2004/0091001 A1 | 5/2004 | Sochava et al. | | |
| 2004/0190582 A1 * | 9/2004 | Brick | ....................... | H01S 5/183 372/97 |
| 2004/0228373 A1 | 11/2004 | Tatsuno et al. | | |
| 2008/0317076 A1 * | 12/2008 | Komiyama | ........... | H01S 5/0687 372/28 |

OTHER PUBLICATIONS

Carr et al., "Stabilisation of Single-longitudinal Mode Operation in a Q-switched Nd:Yag Laser", Optics Communications, vol. 55, No. 3, Sep. 1, 1985, pp. 179-184.

(Continued)

*Primary Examiner* — Xinning (Tom) Niu
(74) *Attorney, Agent, or Firm* — Morrison & Foerster LLP (57) ABSTRACT

A wavelength sensor for wavelength stabilization of a laser beam includes an etalon placed in the laser beam and tilted with respect to the laser beam. Reflected beams from the etalon form an interference pattern on a segmented photodetector having two detector segments. Output signals from the two detector segments are used to derive an error signal for a closed control loop to effect the wavelength stabilization.

20 Claims, 9 Drawing Sheets

(56) References Cited

OTHER PUBLICATIONS

Gardner et al., "A Birefringent Etalon as Single-mode Selector in a Laser Cavity", Optics Express, vol. 12, No. 11, May 2004, pp. 2365-2370.
Hanna et al., "A Simple Technique for Improved Performance of Intracavity Fabry-Perot Frequency Selectors", Optics Communications, vol. 44, 1983, 15 pages.
Shaddock et al., "Frequency Locking a Laser to an Optical Cavity Using Spatial Mode Interference", Optics Letters, vol. 24, No. 21, Aug. 25, 1999, pp. 1-4.
International Search Report and Written Opinion received for PCT Patent Application No. PCT/US2020/042011, dated Nov. 2, 2020, 13 pages.

* cited by examiner

LASER WAVELENGTH STABILIZATION APPARATUS

TECHNICAL FIELD OF THE INVENTION

The present invention relates in general to stabilizing the output wavelength of lasers. The invention relates in particular to stabilizing the output wavelength of lasers operating in a single longitudinal mode.

DISCUSSION OF BACKGROUND ART

There are laser applications where it is desirable to select a single longitudinal mode for operating a laser and to maintain undisturbed operation on the selected mode for relatively long times. For example, laser spectroscopy or trace-gas detection. The single longitudinal mode has a corresponding wavelength within the gain bandwidth of the laser. Generally, a laser resonator operates on a longitudinal mode near a peak in the gain spectrum. In a laser having a resonator length of about 130 millimeters (mm), adjacent longitudinal modes have wavelengths that are spaced apart by as little as 4.3 picometers (pm) in wavelength or equivalently 1130 megahertz (MHz) in frequency.

A consequence of this small spacing is that even a slight perturbation of the resonator length can cause the selected longitudinal mode to drift to a wavelength that has less gain. This drift can induce a "mode hop", when the resonator stops operating on the original mode and resumes operating on another mode that is nearer the peak of the gain. A mode hop can be abrupt or there can be a period of multimode operation during the transition, when at least two longitudinal modes compete for the available gain. An abrupt mode hop can cause a discontinuity, dip, or spike in laser power. A prolonged mode hop causes an increase in the amplitude noise of the laser power. The resonator length may change, for example, due to a change in the ambient temperature around the laser, a change in temperature of an internal component of the resonator, or a mechanical disturbance. Often, the noise imparted on the laser output power is more undesirable than the resulting stepwise shift in output wavelength. Not surprisingly, over the years, certain methods to actively limit mode hopping have been developed.

In one early method, an uncoated etalon was included in a laser resonator and was slightly tilted with respect to a longitudinal axis of the resonator. One of the end mirrors of the resonator was mounted onto a piezoelectric (PZT) transducer, which had an electrical driver to adjust the resonator length. When laser operation started, the etalon initially operated on a longitudinal mode of the resonator at a transmission peak (reflection minimum) of the etalon. A photodetector was arranged to receive any laser radiation reflected from the etalon. A drift in the wavelength of the initial longitudinal mode would cause an increase in the total reflection from the etalon received by the photodetector. The photodetector and the PZT-actuated mirror were incorporated in a feedback loop that actively adjusted the resonator length to keep the total reflected radiation received by the detector at a minimum, thereby maintaining operation on the initial longitudinal mode.

In a paper "*Stabilization of Single-Longitudinal Mode Operation in a Q-Switched Nd:YAG Laser*", by I. D. Carr et al., Optics Communications, Vol. 55, No. 3, pp. 179-184, the authors discuss alleged shortcomings of the stabilization method above. These include unequal surface reflectivities of the etalon, walk-off effects due to the tilt of the etalon, and diffraction spread between successive reflections in the etalon. As a solution, the authors describe an arrangement wherein an etalon is located in the resonator between two quarter-wave plates. The etalon and the quarter-wave plates are located, in turn, between two polarizing beam splitters. The etalon is oriented at normal angle-of-incidence to a resonator axis. Any radiation reflected from the etalon is directed out of the resonator by the innermost of the polarizing beam splitters and passes through another polarizer onto a photodetector. Again, the resonator includes a PZT-actuated end mirror. Again, the photodetector and the PZT-actuated mirror are incorporated in a feedback loop to keep the radiation received by the photodetector at a minimum.

Another polarization-dependent method is described in a paper "*A Birefringent Etalon as a Single-Mode Selector in a Laser Cavity*" by K. S. Gardner et al., Optics Express, Vol. 12, No.11, pp. 2365-2370. A birefringent etalon is placed in a laser cavity (resonator) and is slightly tilted with respect to a resonator axis. A polarization axis of the birefringent etalon is slightly tilted with respect to a polarization plane of laser radiation circulating in the resonator. Laser radiation reflected from the etalon is directed to a polarizing beam splitter, which is rotated at 45 degrees with respect to the polarization plane of the reflected radiation. The polarizing beam splitter resolves the reflected light into two components that are plane-polarized, orthogonally polarized to each other, and are separately detected. A zero-crossing error signal is generated from the sum and difference of the detected components and is used to adjust the resonator length to stabilize operation on one longitudinal mode.

A stabilization method that is not polarization-dependent is described in a paper "*Frequency Locking a Laser to an Optical Cavity using Spatial Mode Interference*", by D. A. Shaddock et al, Optics Letters, Vol. 24, No. 21, pp. 1499-1501. In this method, a single longitudinal mode beam having a $TEM_{00}$ transverse mode of a laser is directed onto one mirror of a slightly misaligned three-mirror ring cavity. A $TEM_{00}$ eigenmode of the ring cavity is coupled into the ring cavity and a high-order $TEM_{01}$ eigenmode of the ring cavity is rejected by the ring cavity. A fraction of the $TEM_{00}$ eigenmode beam and the rejected $TEM_{01}$ eigenmode beam are directed onto a split photodetector that has two independent detecting elements. These two beams optically interfere on the split photodetector. A phase difference between the $TEM_{00}$ mode beam and the $TEM_{01}$ mode beam varies as the $TEM_{00}$ mode drifts in wavelength relative to the $TEM_{01}$ mode. An error signal generated by subtracting the output from each of the detecting elements and is used to correct any wavelength drift in the laser.

No matter how effective any of the above-discussed stabilization methods may be compared to the original tilted intra-cavity etalon, all the methods involve adding two or more optical components to a laser being stabilized, with a corresponding increase in cost of the laser. In the Gardner et al. and Carr et al. methods, at least one birefringent optical element and at least one polarizing beam splitter are required. Birefringent optical elements, which are made from single crystals, are considerably more expensive than non-birefringent optical elements made from an optical glass, such as fused silica. The Shaddock et al. method does not require birefringent elements, but does require at least three coated mirrors, with a corresponding cost of assembly and alignment of the ring cavity.

There is a need for a laser stabilization method that is at least comparable in effectiveness to prior-art methods, but has a minimum of additional optical elements. Preferably, none of the additional optical elements is a birefringent optical element.

SUMMARY OF THE INVENTION

In one aspect, a wavelength sensing apparatus for a laser beam comprises a non-birefringent etalon having first and second parallel surfaces. The etalon is located in the laser beam. A segmented photodetector has first and second detector segments. The etalon is tilted with respect to the laser beam such that first and second reflected beams from respectively the first and second parallel surfaces are directed onto the segmented photodetector to form an interference pattern. The segmented photodetector is located at a far-field distance of the first and second reflected beams. The first and second detector segments produce respectively first and second output signals. Changes in the first and second output signals correspond to changes in the wavelength of the laser beam.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1A:
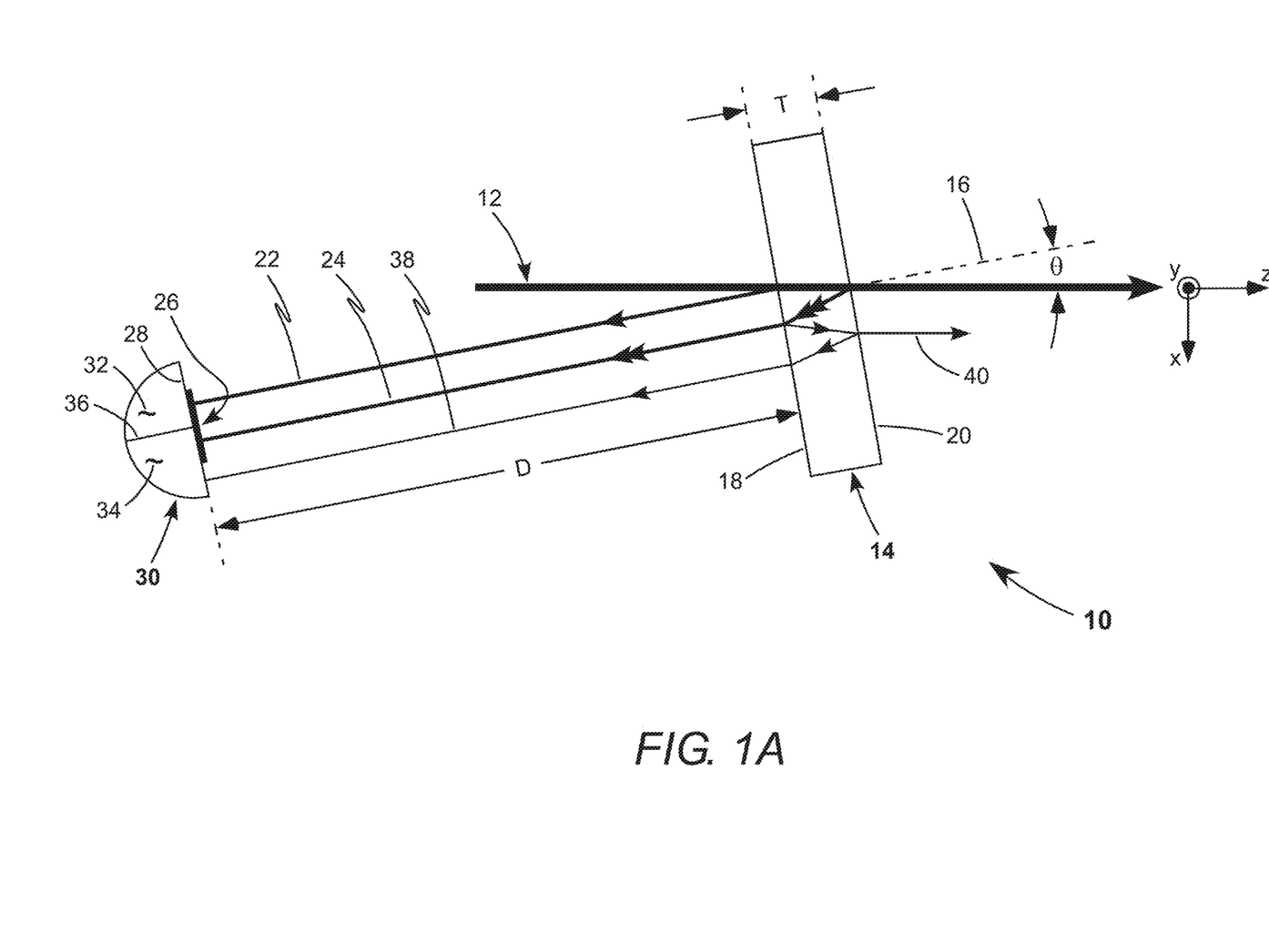
FIGS. 1A and 1B schematically illustrate a preferred embodiment of a wavelength sensing apparatus in accordance with the present invention for tracking wavelength shift in a laser beam, the apparatus including a non-birefringent etalon tilted with respect to the laser beam, causing first and second reflected beams from respectively first and second surfaces of the etalon to form an interference pattern on a segmented photodetector that includes first and second detector segments.

Turning now to the drawings, wherein like features are designated by like reference numerals, FIG. 1A schematically illustrates a preferred embodiment 10 of wavelength sensing (frequency sensing) apparatus in accordance with the present invention, for tracking wavelength shift (frequency shift) in a beam of laser radiation 12. Cartesian axes are depicted for reference, with the x-axis and y-axis arbitrarily assigned. The z-axis is a propagation axis of laser beam 12. Apparatus 10 includes a non-birefringent etalon 14 that is located in laser beam 12 and tilted with respect to laser beam 12. A normal 16 of etalon 14 is tilted at an angle θ with respect to the propagation axis of laser beam 12. Etalon 14 has a plane first surface 18 and a plane second surface 20, which are parallel. The etalon may be made from any glass or crystal that is transparent to the laser radiation, provided the etalon does not exhibit birefringence. By way of example, etalon 14 has a thickness T in a range between about 0.1 mm and about 2.0 mm. Angle θ is in a range between about 1 degree and about 10 degrees. The precise location of etalon 14 in laser beam 12 is not critical, although the etalon is preferably located near a waist in the beam, so the laser beam is collimated or nearly collimated in the etalon.

Tilting etalon 14 with respect to laser beam 12 causes a first beam 22 and a second beam 24, respectively, to be reflected from first surface 18 and second surface 20. These two reflected beams propagate parallel to each other, as illustrated, and form an interference pattern 26 on a receiving surface 28 of a segmented photodetector 30. Interference pattern 26 is discussed in detail hereinbelow. Segmented photodetector 30 has a first detector segment 32 and a second detector segment 34. In apparatus 10, detector segments 32 and 34 are electrically separated by an isolating barrier 36. A suitable segmented photodetector is model SD066-24-21-011-ND two-cell photodiode available from Digi-Key Electronics of Thief River Falls, Minn.

As will be apparent to those skilled in the art, there will be other reflected beams from the etalon. A third such reflected beam 38 and a corresponding transmitted beam 40 are depicted in FIG. 1A. Radiation intensity in third reflected beam 38 is at least two orders-of-magnitude less than in first reflected beam 22 and second reflected beam 24. Therefore, third reflected beam 38 and subsequent reflected beams do not make a significant contribution to the interference pattern. Accordingly, only reflected beams 22 and 24 are depicted in further drawings of the inventive wavelength sensing apparatus. Nevertheless, the calculations depicted and discussed herein include essentially all reflected beams.

Figure 1B:
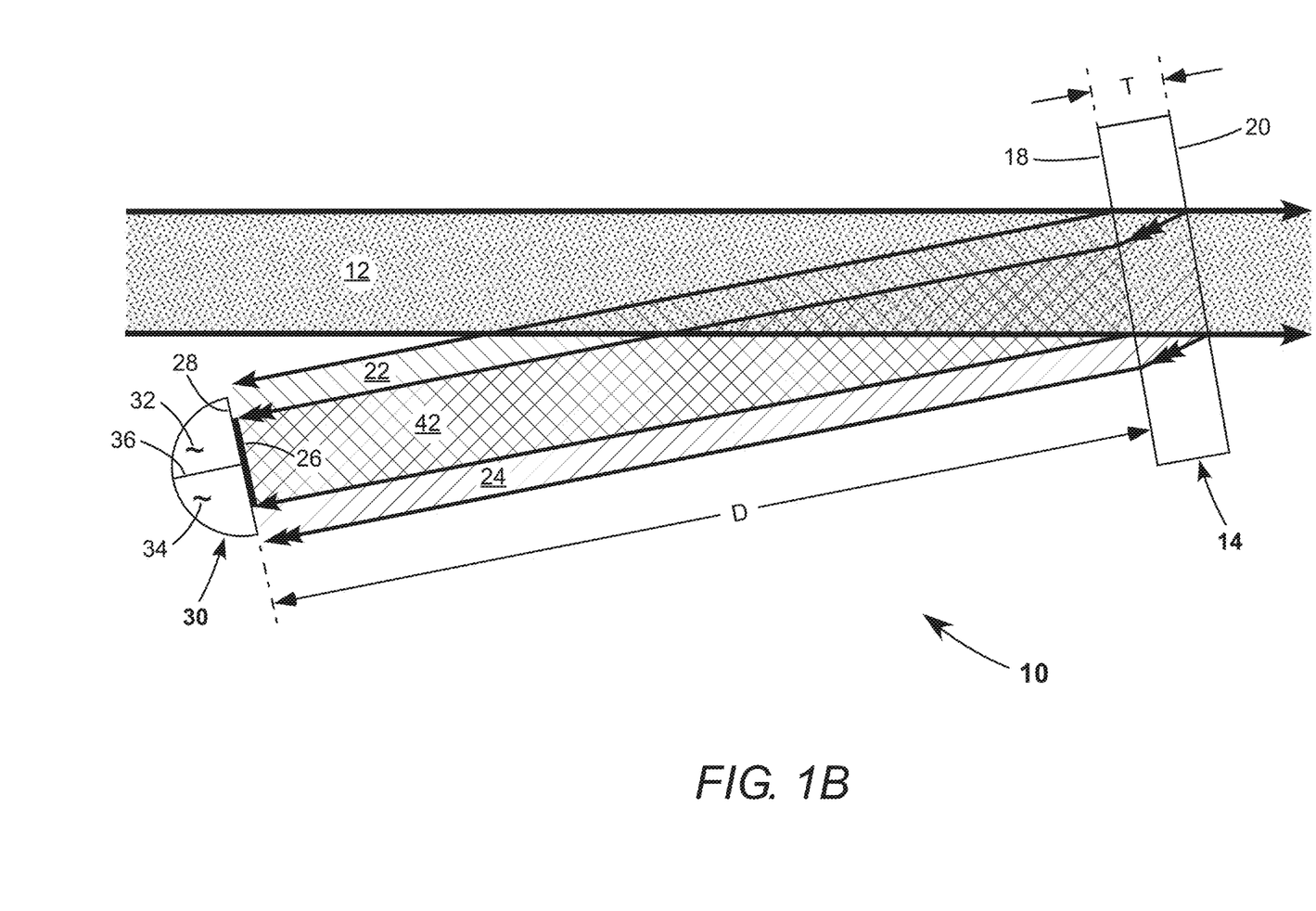

In FIG. 1A, each beam is depicted by the propagation axes of the beam, for simplicity of illustration. However, an etalon operates by optical interference between beams having transverse cross sections. FIG. 1B schematically illustrates wavelength sensing apparatus 10 of FIG. 1A, with laser beam 12 (shaded) and reflected beams 22 and 24 (diagonally hatched) depicted as spatially extended between their respective peripheral rays. Reflected beams 22 and 24 spatially overlap in a volume 42 (cross hatched) and form interference pattern 26 on receiving surface 28. The beams in the drawing are highly collimated. However, it should be noted that when the etalon is located near a waist in the laser beam, diffraction will further spread the reflected beams across the segmented photodetector.

Segmented photodetector 30 is located a distance D from the etalon, which is in the far field of the reflected beams. Preferably, distance D is at least one quarter of the Rayleigh range of the reflected beams. Optionally, a positive lens may be used to focus the reflected beams and thereby shorten distance D. From the description of the present invention herein, one skilled in the art may readily determine an optimum distance D empirically.

Figure 2A:
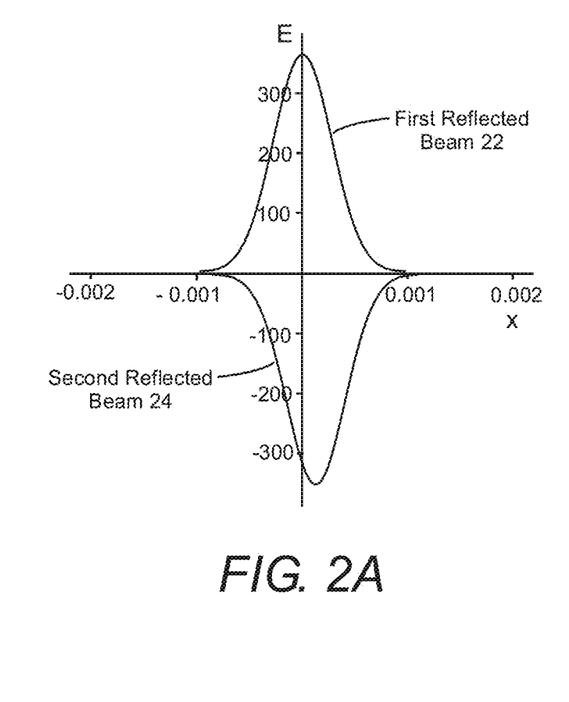
FIGS. 2A and 2B are graphs schematically illustrating calculated electric-field amplitudes across the first and second reflected beams of FIG. 1B in the near field as a function of distance from the center of the first reflected beam, with the reflected beams completely out-of-phase and completely in-phase, respectively.

FIG. 2A is a graph schematically illustrating calculated electric-field amplitude across first reflected beam 22 and second reflected beam 24 of FIG. 1B in the near field, as a function of distance x from the center of the first reflected beam, when the reflected beams are completely out-of-phase. In the calculation, the etalon is located in a waist of the laser beam. The etalon is made of fused silica, has a thickness T of 1 mm, and has a free spectral range of 103 gigahertz (equivalent to 390 pm) at a laser wavelength of 1064 nanometers (nm). Tilt angle η is 5°. The electric-field profiles do not exactly overlap, because of the slight offset between the centers of the reflected beams caused by the tilt of the etalon. The magnitude of the negative peak of second reflected beam 24 is about 4% less than the magnitude of the positive peak of first reflected beam 22, due to additional losses when the second beam encounters both surfaces of the etalon.

Figure 3A:
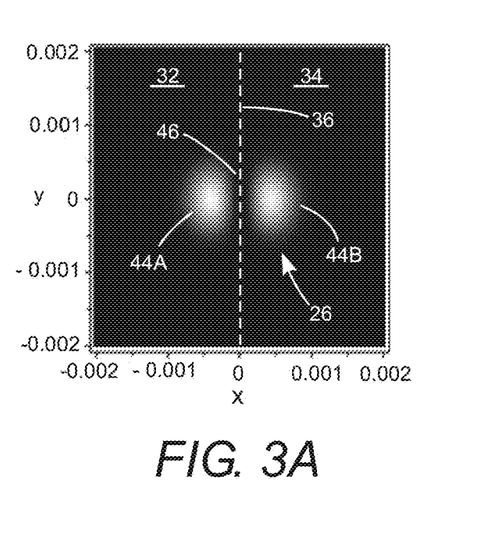
FIGS. 3A, 3B, and 3C are images schematically illustrating calculated two-dimensional spatial intensity distribution of the interference pattern on the detector segments of FIG. 1B, with the first and second reflected beams completely out-of-phase, slightly out-of-phase, and completely in-phase, respectively.

FIG. 3A is an image schematically illustrating the calculated intensity of interference pattern 26 formed by the reflected beams on receiving surface 28 of FIG. 1B, when the reflected beams are completely out-of-phase, as depicted in FIG. 2A. In the calculation, segmented photodetector 30 is located about one Rayleigh range from etalon 14. The interference pattern comprises two relatively-dim lobes 44A and 44B. The lobes are visible because of the inexact overlap of the reflected beams. Between lobes 44A and 44B is a dark fringe 46. The segmented photodetector is preferably arranged such that barrier 36 (indicated by a dashed line) is aligned along the center of dark fringe 46. That is, the lobes of the interference pattern are incident on different detector segments, and barrier 36 is aligned midway between the lobes. A wavelength of laser beam 12 at which the reflected beams are completely out-of-phase corresponds to a minimum total intensity of the interfering reflected beams.

Figure 3B:
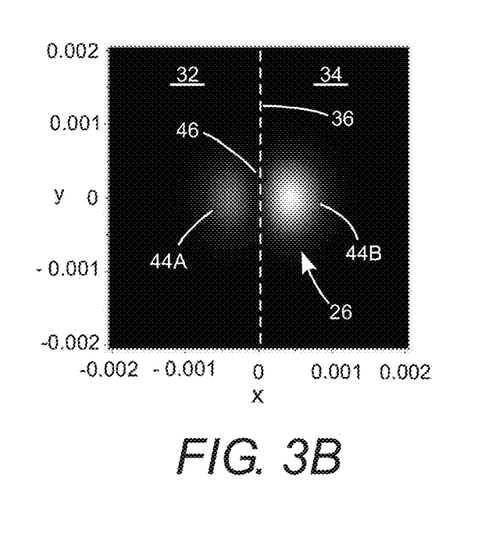

FIG. 3B is an image of interference pattern 26, similar to FIG. 3A, but the reflected beams are slightly out-of-phase. Here, laser beam 12 has a wavelength of about 1064 nm, which is displaced from the completely out-of-phase phase wavelength of FIG. 3A by about 0.0085 nm. As the wavelength of the laser beam drifts away from the completely out-of-phase condition, one of lobes 44A and 44B will become bigger and brighter and the other will become smaller and dimmer. Dark fringe 46 will drift across the interference pattern in the x-direction and will disappear when the reflected beams are completely in-phase. In FIG. 3B, lobe 44B is bigger and brighter, while fringe 46 has drifted to the left.

Figure 2B:
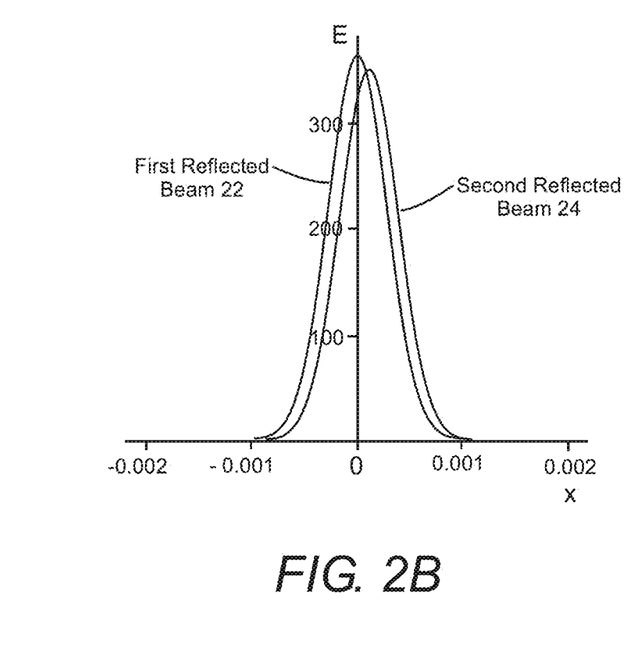
Figure 3C:
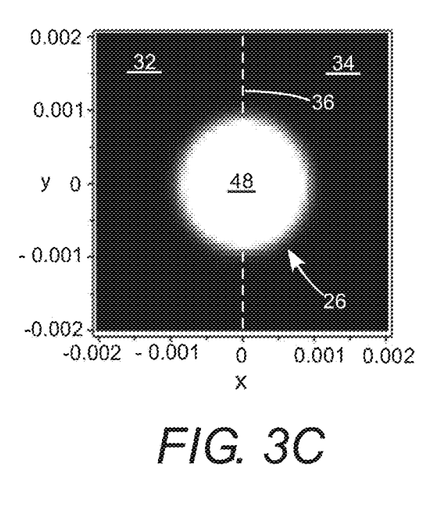

If the wavelength of the laser beam continues to drift, the interference pattern becomes a large bright spot 48 that is centered on barrier 36. This completely in-phase condition is depicted in FIGS. 2B and 3C. Together, FIGS. 2A and 2B and FIGS. 3A-3C illustrate how interference pattern 26 depends on the phase relationship between reflected beam 22 and 24.

Figure 4:
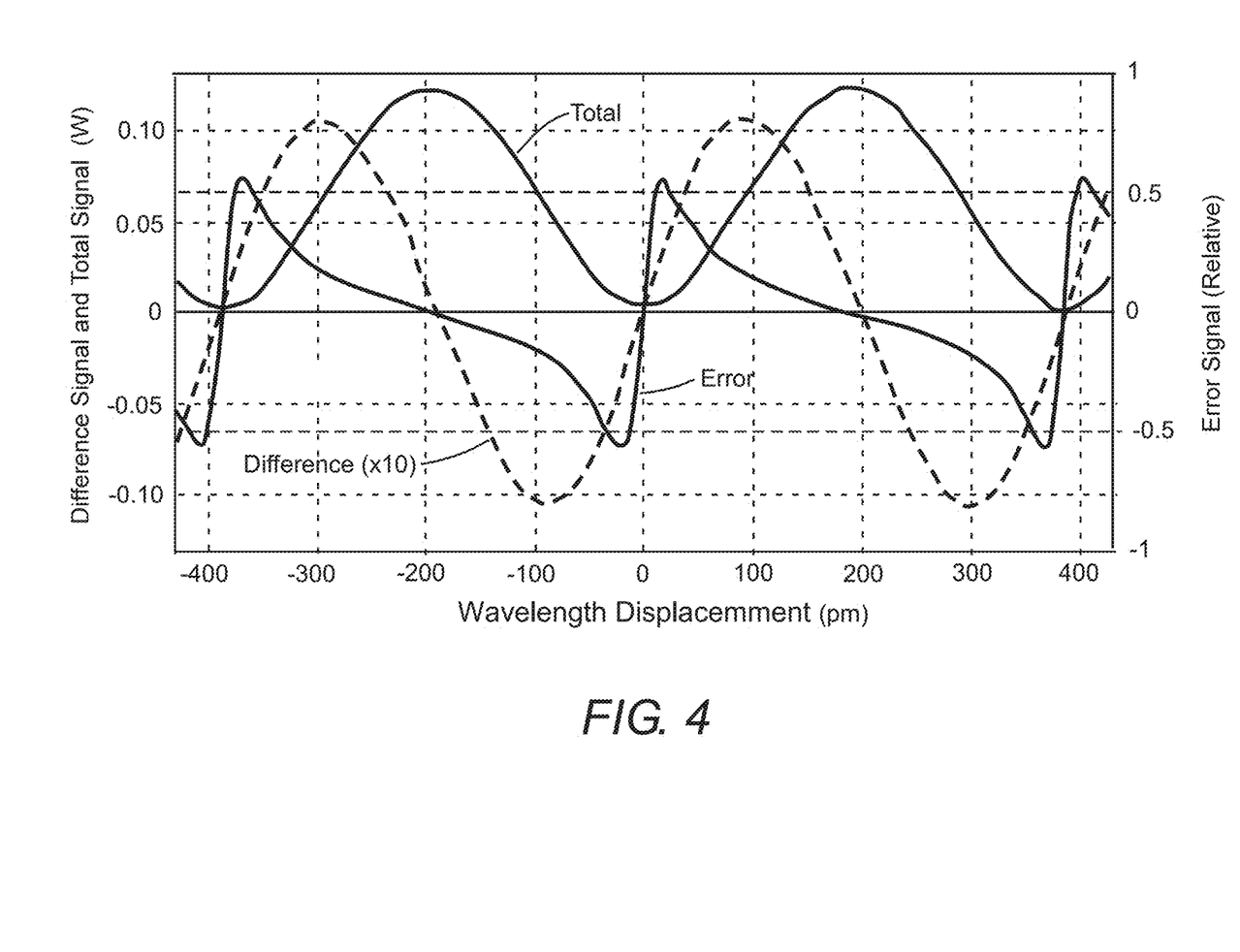
FIG. 4 is graph schematically illustrating difference, total, and error signals derived from output signals of the detector segments of FIG. 1B as a function of wavelength drift of the laser beam.

Detector segments 32 and 34 produce respectively first and second output signals. An error signal is derived by dividing the difference between these two output signals by the total of these two output signals. This error signal is a function of the difference between the laser beam wavelength and a wavelength corresponding to the two reflected beams being completely out-of-phase (an etalon wavelength). These signals are illustrated in FIG. 4, which is a graph of calculated difference signal (scaled by a factor of ten), total signal, and error signal as a function of laser beam wavelength. In the calculation, laser beam 12 has a power of 1 watt (W). In the graph, difference signal and total signal are depicted as watts of optical power incident on the detector segments of photodetector 30. The graph indicates displacement of the laser beam wavelength from an etalon wavelength.

A change in the output signals corresponds to a change in the wavelength of the laser beam. A signal processor (not shown in FIGS. 1A and 1B) can be arranged to receive the output signals and to determine the error signal from them. The error signal represents the phase relationship between reflected beams 22 and 24. The error signal can be used in a closed control loop that changes a parameter to which the wavelength of laser beam 12 is responsive, to keep the error signal at or close to zero, and thereby stabilize the wavelength of the laser beam to an etalon wavelength. For example, the laser parameter could be a resonator length, a pump power, or a tuning element in a laser generating the laser beam.

Figure 5:
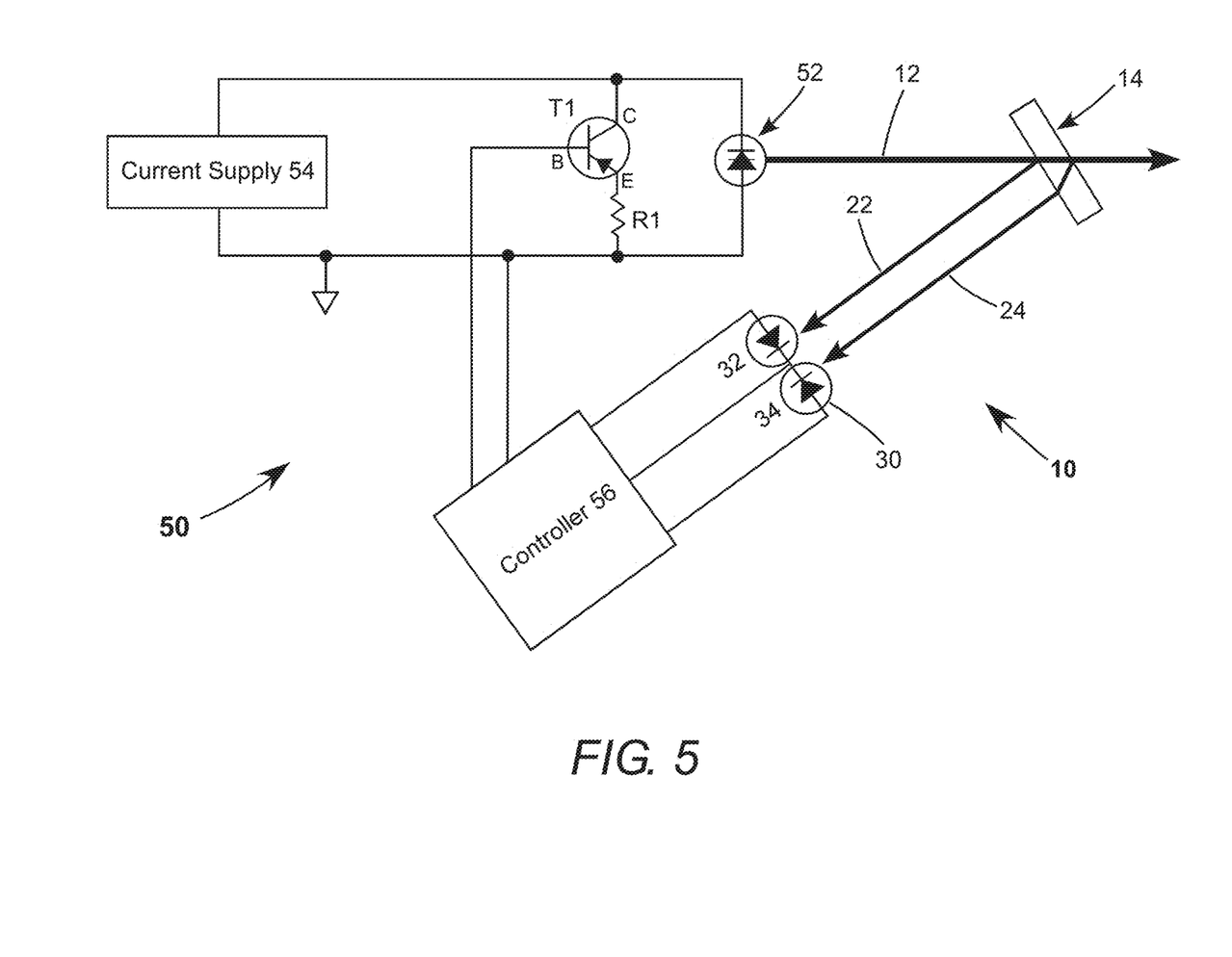
FIG. 5 schematically illustrates a distributed feedback (DFB) diode laser stabilized using the wavelength sensing apparatus of FIG. 1B, wherein the wavelength sensing apparatus is used in a closed control loop which varies drive-current to the DFB diode laser.

FIG. 5 schematically illustrates a wavelength stabilized diode laser apparatus 50, using wavelength sensing apparatus 10 of FIG. 1B. Apparatus 50 includes a distributed feedback (DFB) diode laser 52. DFB diode lasers can be procured commercially as a package, with a periodic structure that provides distributed feedback incorporated into the laser resonator (not shown). A drive current is supplied to DFB diode laser 52 by a current supply (laser driver) 54. The DFB diode laser energized by the drive current delivers an output beam that is designated as beam of laser radiation 12, consistent with the description of wavelength sensing apparatus 10 in FIG. 1A. Wavelength sensing apparatus 10 is clearly outside the resonator of DFB diode laser 52.

A current bypass, connected in parallel with DFB diode laser 52, is formed by a PNP bipolar transistor T1 in series with a load resistor R1. A bypass current flows through resistor R1 and through T1 between emitter E and collector C. Apparatus 10 is used in a closed control loop that varies the drive current to DFB diode laser 52. The interfering reflected beams 22 and 24 from etalon 14 are incident on segmented photodetector 30, with detector segments 32 and 34 of segmented photodetector 30 represented symbolically as individual photodiodes. Detector segments 32 and 34 are electrically connected to a controller 56, which includes a signal processor to determine an error signal, as described above with reference to FIG. 4. Here, the error signal is a voltage applied to base B of transistor T1, which correspondingly varies the current through the current bypass. This, in turn, varies the complementary drive current through DFB diode laser 52. Varying the drive current through the DFB diode varies the wavelength of laser beam 12, by varying the temperature at the diode laser junction, as is known in the art.

Figure 6:
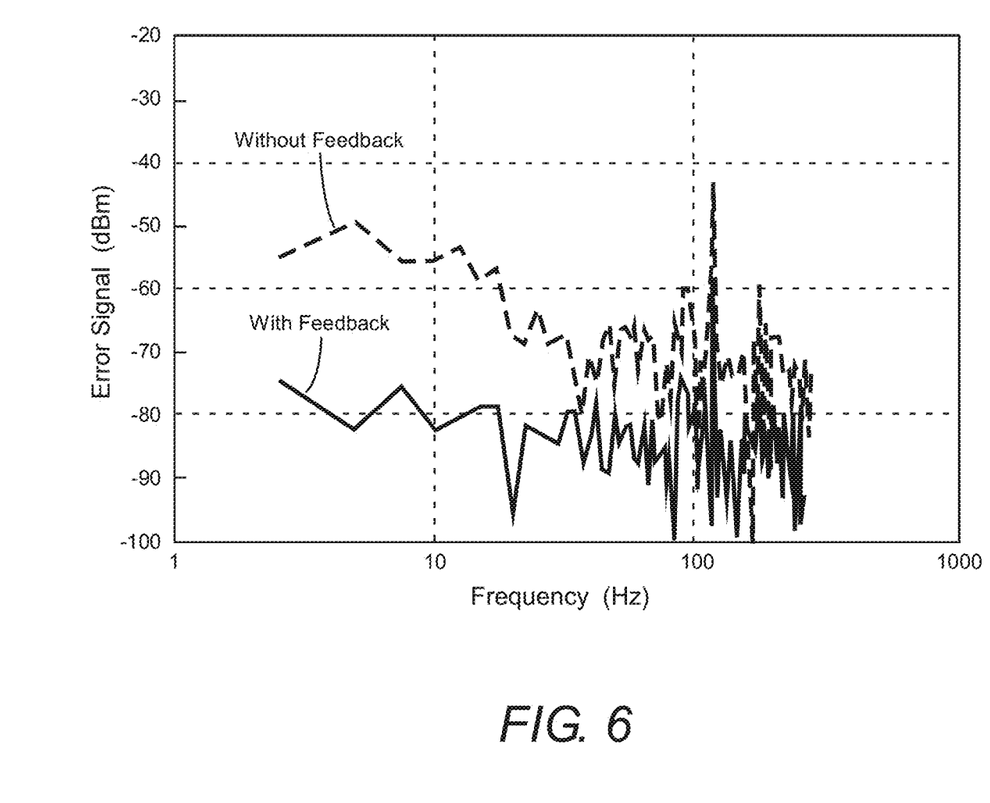
FIG. 6 is a graph schematically illustrating an error signal as a function of frequency for an example of the DFB diode laser of FIG. 5, with and without feedback from the inventive wavelength sensing apparatus.

FIG. 6 schematically illustrates measured error signal in one example of wavelength stabilized diode laser apparatus 50 of FIG. 5 as a function of frequency. The error signal, here, is scaled to 20 volts (V) and assumes a 50 ohm electrical load. 20 V corresponds to a hypothetical interference pattern that irradiates just one of the photodetector segments with all of the optical power. These are essentially power spectra, illustrating noise in the wavelength (frequency) of the laser beam. By way of example, a sinusoidal modulation of the wavelength would appear as a peak in the power spectrum at the frequency of the sinusoidal modulation. For DFB diode laser 52, using wavelength sensing apparatus 10, the wavelength of the laser beam is measured with respect to an etalon wavelength. In FIG. 6, the relative noise spectra were measured with and without feedback from the inventive wavelength sensing apparatus; that is, with the wavelength of the DFB diode laser stabilized and not stabilized. When not stabilized, the energized DFB diode laser is free running.

In this example, DFB diode laser 52 was a model CMDFB1064A available from II-VI Laser Enterprise GmbH of Zurich, Switzerland. This DFB diode laser has a nominal output wavelength of 1064 nm. Segmented photodetector 30 was a model SD066-24-21-011-ND as exemplified above. Etalon 14 of apparatus 10 was a fused silica etalon having thickness T of 0.3 mm. The etalon was inclined to laser beam 12 at an angle of about 5°. Distance D between etalon 14 and segmented photodetector 30 was about 500 mm.

It can be seen that for frequencies less than about 10 Hz, the relative noise when stabilized (with feedback) is about 25 decibels (dBm) less than the relative noise when not stabilized (without feedback). At frequencies between about 10 Hz and 100 Hz, the difference between the noise spectra when stabilized and when not stabilized becomes progressively less, due to the thermal-response time at the diode laser junction of a few hundred milliseconds. Essentially, the thermal inertia of the diode laser inhibits the desired feedback modulation at higher frequencies.

Figure 7:
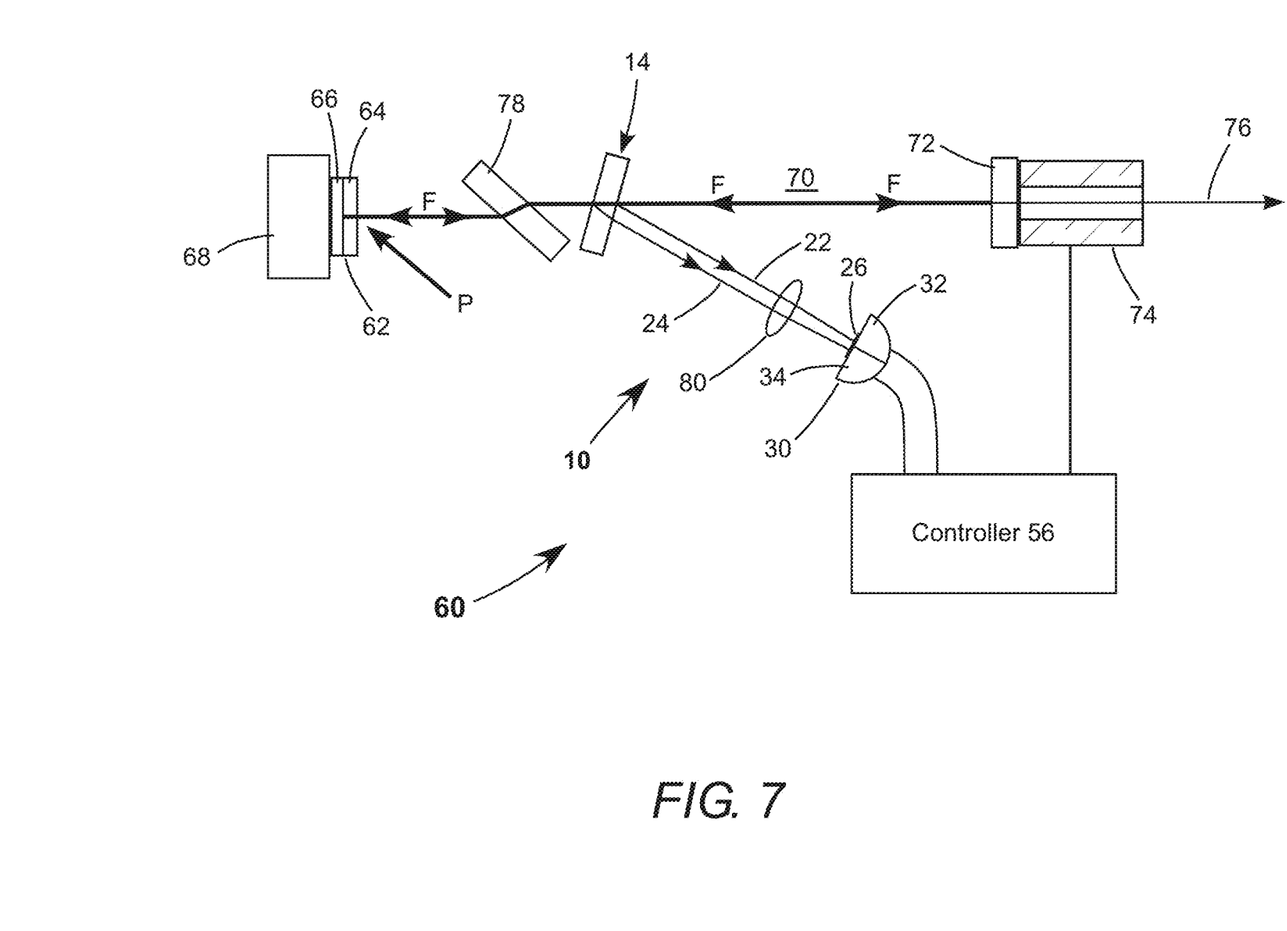
FIG. 7 schematically illustrates an optically-pumped semiconductor (OPS) laser stabilized using the wavelength sensing apparatus of FIG. 1B, wherein the wavelength sensing apparatus is used in a closed control loop which varies the resonator-length of the OPS laser.

FIG. 7 schematically illustrates an optically-pumped semiconductor (OPS) laser 60 stabilized using wavelength sensing apparatus 10 of FIG. 1B. OPS laser 60 includes an OPS chip 62, which has a semiconductor gain structure 64 surmounting a highly-reflecting mirror structure 66. The OPS chip is bonded to a heat sink 68. Gain structure 64 is energized by optical pumping, here, by pump radiation P supplied by a diode laser array (not shown). OPS laser 60 has a linear resonator 70 formed between highly-reflecting mirror structure 66 of OPS chip 62 and a partially-transmitting output-coupling mirror 72 mounted on a PZT 74. In response to the optical pumping, a beam of laser radiation having a fundamental wavelength circulates in resonator 70, as indicated by arrows F. A beam of output laser radiation 76 is transmitted through output-coupling mirror 72. Typically, a birefringent filter 78 provides coarse wavelength selection (frequency selection).

Etalon 14 of apparatus 10, here, is located in resonator 70 between birefringent filter 78 and output-coupling mirror 72. The circulating laser beam within the resonator is comparable to laser beam 12 of FIG. 1B, except that the circulating laser beam in the resonator is bi-directional. Reflected beams 22 and 24 from etalon 14 form interference pattern 26 on detector segments 32 and 34 of segmented photodetector 30, as described above with reference to FIGS. 1A, 1B, 3A, 3B, and 3C. An optional lens 80 may be located in the reflected beams between the etalon and the photodetector to shorten the distance to the detector, as discussed above, and to demagnify the interfering beams incident on the photodetector.

Detector segments 32 and 34 are electrically connected to a controller 56, which includes a signal processor to derive an error signal from output signals of the detector segments, as described above. Here, the controller applies a voltage to PZT 74 that is responsive to the error signal. The applied voltage varies the length of the resonator and thereby varies the wavelength (frequency) of circulating laser beam F. This closed control loop maintains the error signal at or close to zero.

It should be noted, here, that only sufficient description of OPS laser 60 is provided for understanding principles of the present invention. A detailed description of OPS lasers, including several different resonator configurations, is provided in U.S. Pat. No. 6,097,742, assigned to the assignee of the present invention, and the complete disclosure of which is hereby incorporated herein by reference.

Figure 8:
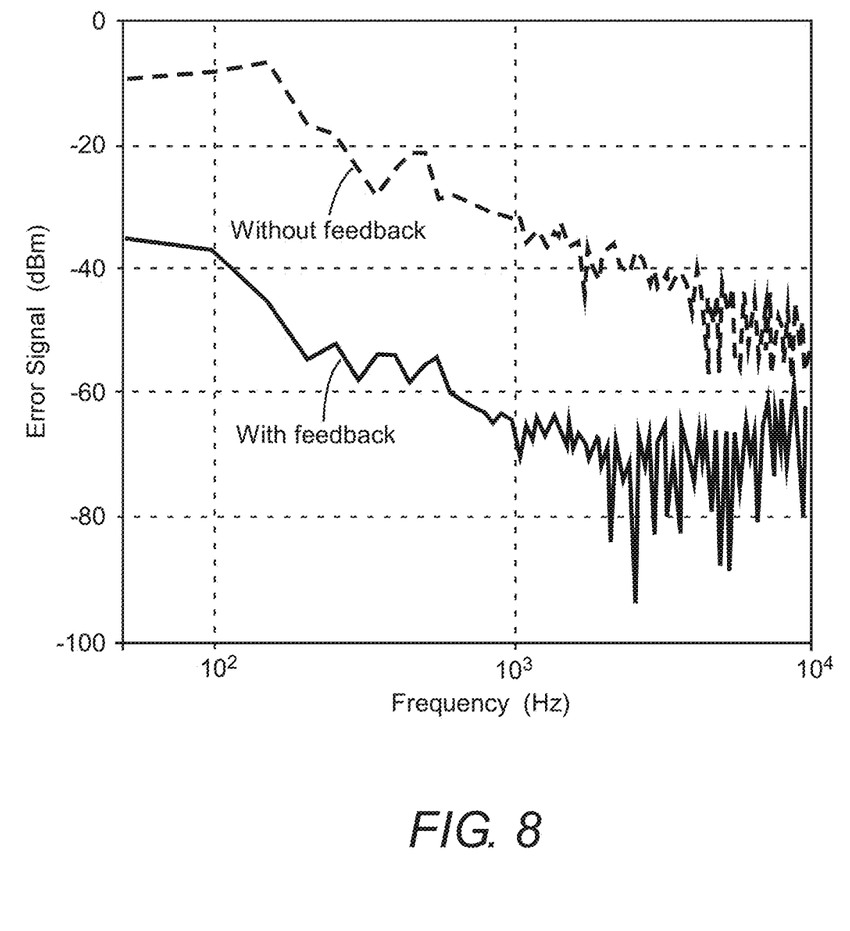
FIG. 8 is a graph schematically illustrating an error signal as a function of frequency for an example of the OPS laser of FIG. 7, with and without feedback from the inventive wavelength sensing apparatus.

FIG. 8 schematically illustrates measured error signal in one example of OPS laser 60 of FIG. 7 as a function of frequency. Again, these are essentially power spectra of noise in the wavelength of the laser beam, measured with and without feedback from the inventive wavelength sensing apparatus. In this example, the OPS laser was arranged to deliver output laser beam 76 at a wavelength of about 1064 nm. The resonator length was 130 mm. PZT 74 was a model PK25LA2P2 round PZT stack available from Thorlabs of Newton, N.J. Segmented photodetector 30 was a model SD066-24-21-011-ND photodiode as exemplified above. Etalon 14 was made of fused-silica and had a thickness of 1 mm. The etalon was inclined to the circulating laser beam at an angle of about 5 degrees. The distance from the etalon to segmented photodetector 30 was about 500 mm. Lens 80 had a focal length of about 250 mm and was included to fit the incident beam within the physical dimensions of segmented photodetector 30. The lens could have been omitted if a larger photodetector had been used.

It can be seen in FIG. 8 that the maximum reduction in relative noise of 25 to 30 dB, with feedback compared to without feedback, is similar to FIG. 6. However, for the OPS laser of FIG. 8, this reduction is maintained up to a few kilohertz. At higher frequencies, the noise spectra begin to converge, due to diminishing mechanical agility of the PZT-actuated mirror. Essentially, mechanical resonances of the PZT-actuated mirror distort the feedback modulation at higher frequencies. In a separate experiment, with a different OPS laser having a resonator-length of about 340 mm, the maximum reduction in noise was maintained up to about 10 KHz.

In the description provided above, the wavelength sensing apparatus and method of the present invention are applied to a DFB diode laser and an OPS laser with a linear resonator. However, the inventive wavelength sensing apparatus would be effective with other types of solid-state laser and also for lasers having a ring resonator. For solid-state lasers generating sufficient output power, the inventive wavelength sensing apparatus may be deployed outside the resonator, as depicted in FIG. 5 for the DFB diode laser. The inventive wavelength sensing apparatus may also be used in intracavity frequency-converted lasers.

An etalon wavelength is usually temperature dependent, due to the coefficient of thermal expansion and the temperature dependence of the index of refraction of the transparent material the etalon is made of. A temperature change in the etalon changes thickness T of the etalon and also optical lengths in the etalon. In order to maintain a constant wavelength, it may be necessary to regulate the temperature of the etalon. Alternatively, to tune the output wavelength of a laser, the temperature of the etalon could be deliberately changed. The inventive wavelength sensing apparatus in a closed control loop would tune the wavelength by continuously minimizing the error signal.

In the examples above, the segmented photodetector was a photodiode having two photocells divided by an isolating barrier, which is convenient commercial device to incorporate into the inventive wavelength sensing apparatus. Alternatively, the segmented photodetector could be a photodiode array or a pair of discrete photodiodes, arranged such that each photodiode intercepts just one lobe of the interfering reflected beams. As FIGS. 2B and 2D illustrate, the segmented photodetector could be a camera or other imaging device, with the detector segments being two halves of an image. The two output signals would be derived by integrating each half of the image.

In summary, it was discovered that with an etalon placed in a laser beam and tilted with respect to the laser beam, an interference pattern is formed in the far field of beams reflected from the etalon. This interference pattern can be directed onto a segmented photodetector to derive an error signal that corresponds to the wavelength of the laser beam. This enables the etalon and the segmented photodetector to function as a wavelength sensor. The error signal can be used in a closed control loop to minimize wavelength drift of the laser beam. This is described above and deployed differently in two types of laser. Other laser types to which the invention is applicable are suggested. Unlike prior-art wavelength stabilizing apparatuses, which require several relatively expensive optical components, in a simplest form the inventive wavelength sensor requires only one additional optical element, an uncoated and non-birefringent etalon. Such etalons may be manufactured in relatively large batches with correspondingly low cost.

The present invention is described here as a preferred embodiment deployed in examples of two types of laser. It should be noted, however, that the present invention is not limited by the preferred embodiment and examples described and depicted herein. Rather, the invention is limited only by the claims appended hereto.

What is claimed is:

1. A wavelength sensing apparatus for a laser beam comprising:
    a non-birefringent etalon having first and second parallel surfaces, the etalon located in the laser beam; and
    a segmented photodetector having first and second detector segments, the etalon being tilted with respect to the laser beam such that first and second reflected beams from respectively the first and second parallel surfaces are directed onto the segmented photodetector to form an interference pattern, the segmented photodetector located at a far-field distance of the first and second reflected beams, the first and second detector segments producing respectively first and second output signals, changes in the first and second output signals corresponding to changes in the wavelength of the laser beam.

2. The apparatus of claim 1, further including a signal processor receiving the first and second output signals, and deriving therefrom an error signal that is representative of a phase relationship between the first and second reflected beams.

3. The apparatus of claim 2, wherein the error signal is derived by dividing a difference between the first and second output signals by a total of the first and second output signals.

4. The apparatus of claim 3, wherein the error signal is zero when the first and second reflected beams are completely out-of-phase.

5. The apparatus of claim 1, wherein the laser beam is an output beam of a laser.

6. The apparatus of claim 1, wherein the laser beam is circulating within a laser resonator.

7. The apparatus of claim 1, wherein the interference pattern includes two lobes that are incident on different detector segments when the first and second reflected beams are out-of-phase.

8. An optical apparatus comprising:
    a laser delivering a beam of laser radiation;
    a non-birefringent etalon having first and second parallel surfaces, the etalon located in the beam of laser radiation;
    a segmented photodetector having first and second detector segments, the etalon being tilted with respect to the beam of laser radiation such that first and second reflected beams from respectively the first and second parallel surfaces are directed onto the segmented photodetector to form an interference pattern, the segmented photodetector located at a far-field distance of the first and second reflected beams, the first and second detector segments producing respectively first and second output signals; and
    a controller arranged to receive the first and second output signals and to derive therefrom an error signal that is representative of a phase relationship between the first and second reflected beams;
    wherein a parameter of the laser is changed in response to the error signal to stabilize a wavelength of the beam of laser radiation.

9. The apparatus of claim 8, wherein the laser is a diode laser.

10. The apparatus of claim 8, wherein the parameter is a drive current energizing the laser.

11. The apparatus of claim 8, wherein the error signal is derived by dividing a difference between the first and second output signals by a total of the first and second output signals.

12. The apparatus of claim 8, wherein the error signal is zero when the first and second reflected beams are completely out-of-phase.

13. The apparatus of claim 8, wherein the interference pattern includes two lobes that are incident on different detector segments when the first and second reflected beams are out-of-phase.

14. An optical apparatus comprising:
    a laser including a resonator in which a laser beam circulates, the resonator having a resonator length;
    a non-birefringent etalon having first and second parallel surfaces, the etalon located in the circulating laser beam;
    a segmented photodetector having first and second detector segments, the etalon being tilted with respect to the circulating laser beam such that first and second reflected beams from respectively the first and second parallel surfaces are directed onto the segmented photodetector and form an interference pattern, the segmented photodetector located at a far-field distance of the first and second reflected beams, the first and second detector segments producing respectively first and second output signals; and
    a controller arranged to receive the first and second output signals and to derive therefrom an error signal that is representative of a phase relationship between the first and second reflected beams;
    wherein a parameter of the laser is changed in response to the error signal to stabilize a wavelength of the circulating laser beam.

15. The apparatus of claim 14, wherein the laser is an optically-pumped semiconductor laser.

16. The apparatus of claim 14, wherein the parameter is the resonator length.

17. The apparatus of claim 16, wherein the laser-resonator is formed between a highly reflecting mirror and a partially transmitting output-coupling mirror, the output-coupling mirror mounted on a piezoelectric transducer, and wherein a voltage applied to the piezoelectric transducer is responsive to the error signal and varies the length of the resonator.

18. The apparatus of claim 14, wherein the error signal is zero when the first and second reflected beams are completely out-of-phase.

19. The apparatus of claim 14, wherein a lens is located in the first and second reflected beams between the etalon and the photodetector.

20. The apparatus of claim 14, wherein the interference pattern includes two lobes that are incident on different detector segments when the first and second reflected beams are out-of- phase.

\* \* \* \* \*